US007539277B2

(12) United States Patent
Cao

(10) Patent No.: US 7,539,277 B2
(45) Date of Patent: May 26, 2009

(54) BINARY STREAM SWITCHING CONTROLLED MODULUS DIVIDER FOR FRACTIONAL FREQUENCY SYNTHESIS

(75) Inventor: Lipeng Cao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 683 days.

(21) Appl. No.: 11/222,543

(22) Filed: Sep. 9, 2005

(65) Prior Publication Data

US 2007/0058767 A1    Mar. 15, 2007

(51) Int. Cl.
    *H03D 3/24*    (2006.01)
(52) U.S. Cl. ....................................................... 375/376
(58) Field of Classification Search ................. 375/371, 375/375, 376
    See application file for complete search history.

(56) References Cited

U.S. PATENT DOCUMENTS

| 5,604,468 | A  | * | 2/1997 | Gillig ............................ 331/176 |
| 6,594,330 | B1 | * | 7/2003 | Wilson ........................... 375/376 |
| 6,779,010 | B2 | * | 8/2004 | Humphreys et al. ........... 708/490 |
| 7,365,607 | B2 | * | 4/2008 | Fahim ........................... 331/1 A |
| 2003/0141912 | A1 | * | 7/2003 | Sudjian .......................... 327/208 |

OTHER PUBLICATIONS

Stork, Milan et al.; "Fractional Phase-Locked Loop Frequency Synthesizer"; International Symposium on Signals, Circuits and Systems 2003; Jul. 10-11, 2003; vol. 1; pp. 129-132; IEEE, USA.

Tsai, Chia-Chun et al.; "A Fractional Frequency Synthesizer Based on ADPLL"; 2003 International Symposium on VLSI Technology, Systems, and Applications; Oct. 6-8, 2003; pp. 151-154; IEEE; USA.

Heng, Chun-Huat et al.; "A 1.8-GH$_z$ CMOS Fractional-$N$ Frequency Synthesizer With Randomized Multiphase VCO"; IEEE Journal of Solid State Circuits; Jun. 2003; pp. 848-854; vol. 38, No. 6, IEEE; USA.

Stork, M.; "New Franctional Phase-Locked Loop Frequency Synthesizer Using a Sigma-Delta Modulator"; 14th International Conference on Digital Signal Processing; Jul. 2002; pp. 367-370; IEEE; USA.

De Muer, Bram, et al.; "A CMOS Monolithic ΔΣ-Controlled Fractional-$N$ Frequency Synthesizer for DCS-1800"; IEEE Journal of Solid-State Circuits; Jul. 7, 2002; vol. 37, No. 7; pp. 835-844; IEEE; USA.

(Continued)

*Primary Examiner*—Chieh M Fan
*Assistant Examiner*—Jaison Joseph
(74) *Attorney, Agent, or Firm*—Ingrassia, Fisher & Lorenz, P.C.

(57) ABSTRACT

A modulus divider controller coupled to a modulus divider for generating a synthesized clock from a reference clock, wherein the modulus divider generates a divided clock, is provided. The modulus divider controller may further include a first binary stream switching circuit having a first output and a second output. The first binary stream switching circuit may further have a logic low input and a logic high input and a first switching input corresponding to a most significant bit of a count generated by a synchronous counter, wherein the synchronous counter counts the divided clock. The first binary stream switching circuit may further have a second switching input corresponding to a least significant bit of a division control word, wherein the division control word specifies a fractional division ratio for the synthesized clock.

17 Claims, 6 Drawing Sheets

OTHER PUBLICATIONS

Diorio, Chris et al.; "A 5.5 GHz Fractional Frequency-Synthesizer IC"; Gallium Arsenide Integrated Circuit (GsAs IS) Symposium Technical Digest 1997; Oct. 12-15, 1997; pp. 248-251; IEEE; USA.

Foroudi, Navid et al.; CMOS High-Speed Dual-Modulus Frequency Divider for RF Frequency Synthesls; IEEE Journal of Solid-State Circuits; Feb. 1991; vol. 30, No. 1; pp. 93-100; IEEE; USA.

* cited by examiner

| SCNTR[2:5] (220) | STAGE 0 (222) MS FS DO UO | STAGE 1 (224) MS FS DO UO | STAGE 2 (226) MS FS DO UO | STAGE 3 (228) MS FS DO UO |
|---|---|---|---|---|
| 0000 | 0 0 0 0 | 0 0 0 0 | 0 1 0 0 | 0 1 0 0 |
| 0001 | 1 0 0 1 | 0 0 0 0 | 0 1 0 0 | 0 1 0 0 |
| 0010 | 0 0 0 0 | 1 0 0 0 | 0 1 0 0 | 0 1 0 0 |
| 0011 | 1 0 0 1 | 1 0 0 1 | 0 1 0 1 | 0 1 0 1 |
| 0100 | 0 0 0 0 | 0 0 0 0 | 1 1 0 0 | 0 1 0 0 |
| 0101 | 1 0 0 1 | 0 0 0 0 | 1 1 0 0 | 0 1 0 0 |
| 0110 | 0 0 0 0 | 1 0 0 0 | 1 1 0 0 | 0 1 0 0 |
| 0111 | 1 0 0 1 | 1 0 0 1 | 1 1 1 1 | 0 1 1 1 |
| 1000 | 0 0 0 0 | 0 0 0 0 | 0 1 0 0 | 1 1 0 0 |
| 1001 | 1 0 0 1 | 0 0 0 0 | 0 1 0 0 | 1 1 0 0 |
| 1010 | 0 0 0 0 | 1 0 0 0 | 0 1 0 0 | 1 1 0 0 |
| 1011 | 1 0 0 1 | 1 0 0 1 | 0 1 0 1 | 1 1 1 1 |
| 1100 | 0 0 0 0 | 0 0 0 0 | 1 1 0 0 | 1 1 0 0 |
| 1101 | 1 0 0 1 | 0 0 0 0 | 1 1 0 0 | 1 1 0 0 |
| 1110 | 0 0 0 0 | 1 0 0 0 | 1 1 0 0 | 1 1 0 0 |
| 1111 | 1 0 0 1 | 1 0 0 1 | 1 1 1 1 | 1 1 1 1 |
| 0000 | 0 0 0 0 | 0 0 0 0 | 0 1 0 0 | 0 1 0 0 |
| 0001 | 1 0 0 1 | 0 0 0 0 | 0 1 0 0 | 0 1 0 0 |
| 0010 | 0 0 0 0 | 1 0 0 0 | 0 1 0 0 | 0 1 0 0 |
| 0011 | 1 0 0 1 | 1 0 0 1 | 0 1 0 1 | 0 1 0 1 |
| 0100 | 0 0 0 0 | 0 0 0 0 | 1 1 0 0 | 0 1 0 0 |
| 0101 | 1 0 0 1 | 0 0 0 0 | 1 1 0 0 | 0 1 0 0 |
| 0110 | 0 0 0 0 | 1 0 0 0 | 1 1 0 0 | 0 1 0 0 |
| 0111 | 1 0 0 1 | 1 0 0 1 | 1 1 1 1 | 0 1 1 1 |
| 1000 | 0 0 0 0 | 0 0 0 0 | 0 1 0 0 | 1 1 0 0 |
| 1001 | 1 0 0 1 | 0 0 0 0 | 0 1 0 0 | 1 1 0 0 |
| 1010 | 0 0 0 0 | 1 0 0 0 | 0 1 0 0 | 1 1 0 0 |
| 1011 | 1 0 0 1 | 1 0 0 1 | 0 1 0 1 | 1 1 1 1 |
| 1100 | 0 0 0 0 | 0 0 0 0 | 1 1 0 0 | 1 1 0 0 |
| 1101 | 1 0 0 1 | 0 0 0 0 | 1 1 0 0 | 1 1 0 0 |
| 1110 | 0 0 0 0 | 1 0 0 0 | 1 1 0 0 | 1 1 0 0 |
| 1111 | 1 0 0 1 | 1 0 0 1 | 1 1 1 1 | 1 1 1 1 |
| 0000 | 0 0 0 0 | 0 0 0 0 | 0 1 0 0 | 0 1 0 0 |

230: FRAC[0:3] = 0011

BINARY STREAM SWITCHING CONTROLLED MODULUS DIVIDER FOR FRACTIONAL FREQUENCY SYNTHESIS

FIELD OF THE INVENTION

The present invention relates generally to frequency synthesis, and more particularly to a binary stream switching controlled modulus divider for fractional frequency synthesis.

RELATED ART

Phase locked loop (PLL) circuits or delay locked loop (DLL) circuits may generate multiple frequencies from a fixed reference clock. In the PLL based fractional frequency synthesis approach, use of fixed integer division causes the PLL to generate coarse discrete frequencies. In general, for power and performance optimization, finer discrete frequencies are required, particularly, in dynamic voltage and frequency scaling applications. Typically, finer discrete frequencies are generated using a PLL by employing fractional division of the fixed reference clock.

Traditionally, fractional frequency synthesis from a fixed reference clock using PLL causes higher processing overhead. This is because, typically, fractional division of the fixed reference clock is accomplished using modules, such as a delta-sigma modulator, multi-phase voltage controlled oscillator, multi-phase frequency divider, and/or other complicated control logic.

Thus, there is a need for a better approach to accomplish fractional frequency synthesis from a fixed reference clock using PLL.

BRIEF DESCRIPTION OF THE DRAWINGS

The present invention is illustrated by way of example and not limited by the accompanying figures, in which like references indicate similar elements, and in which:

FIG. 5 is a diagram illustrating inputs and outputs for a series of cascaded binary stream switching circuits, consistent with one embodiment of the invention.

Figure 1:
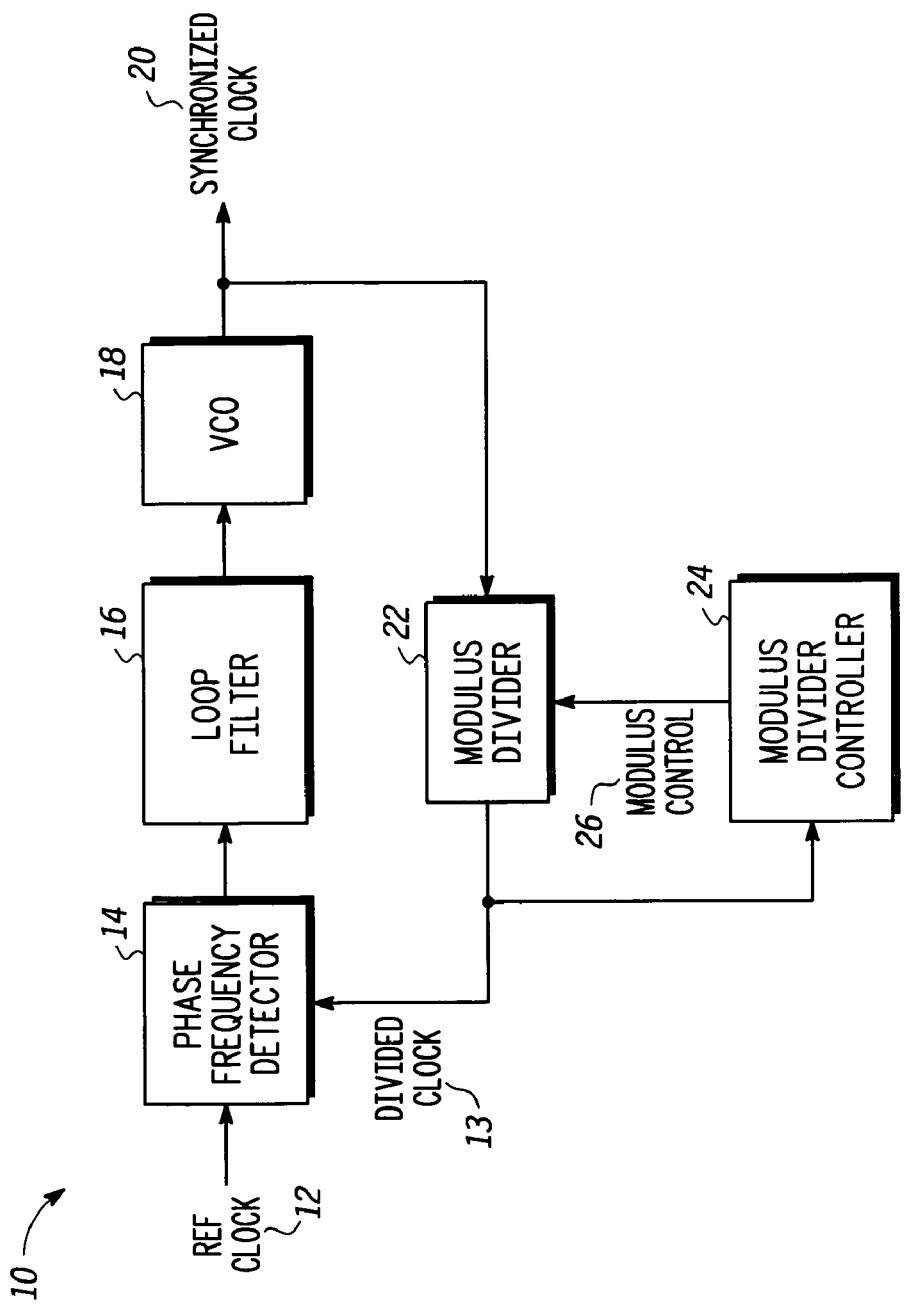
FIG. 1 is a block diagram of an exemplary fractional frequency synthesizer, consistent with one embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE EMBODIMENTS

In one embodiment, fractional frequency synthesis from a fixed reference clock using PLL can be achieved by using the properties of a binary number stream. The binary number stream can be used to generate a control signal of a modulus divider for fractional frequency synthesis. By way of example, a synchronous binary number counter combined with fractional digital values can be used to control a specially designated cascaded signal stream switching circuit. Fractional division control signals may be generated hierarchically by the stream switching circuit.

In one aspect, a modulus divider controller coupled to a modulus divider for generating a synthesized clock from a reference clock, wherein the modulus divider generates a divided clock, is provided. The modulus divider controller may include a first binary stream switching circuit having a first output and a second output. The first binary stream switching circuit may further have a logic low input and a logic high input and a first switching input corresponding to a least significant bit of a count generated by a synchronous counter, wherein the synchronous counter counts the divided clock. The first binary stream switching circuit may further have a second switching input corresponding to a most significant bit of a division control word, wherein the division control word specifies a fractional division ratio for the synthesized clock. The modulus divider controller may further include a second binary stream switching circuit having the first output of the first binary stream switching circuit as a first input and the second output of the first binary stream switching circuit as a second input. The second binary stream switching circuit may further have a first switching input corresponding to a bit next to the least significant bit of the count generated by the synchronous counter and a second switching input corresponding to a bit next to the most significant bit of the division control word, wherein the second binary stream switching circuit generates a modulus control output for the modulus divider based on the first input, the second input, the first switching input, and the second switching input corresponding to the second binary stream switching circuit.

In another aspect, a method for generating a synthesized clock from a reference clock using a modulus divider is provided. The method may include receiving a pair of inputs and generating a selected pair of outputs based on an input corresponding to a division control word, wherein the division control word specifies a fractional division ratio for the synthesized clock. The method may further include generating a modulus divider control output based on the selected pair of outputs.

FIG. 1 is a block diagram of an exemplary fractional frequency synthesizer, consistent with one embodiment of the invention. As shown in FIG. 1, an exemplary fractional frequency synthesizer 10 may include a phase frequency detector 14, which may detect a phase, frequency, or phase and frequency difference between a reference clock 12 and a divided clock 13. Based on the detected difference, phase frequency detector 14 may generate a voltage that may be filtered by loop filter 16 and used to control a voltage controlled oscillator 18 (VCO). Voltage controlled oscillator 18 may generate synthesized clock 20, which may be fed back via a modulus divider 22 to phase frequency detector 14. A modulus divider controller 24 may generate a modulus control signal 26, which may be used to control modulus divider 22. By way of example, modulus control signal 26 may be logic high or logic low. When modulus control signal 26 is logic low, modulus divider 22 may divide synthesized clock 20 by an integer, such as N, or alternatively by N1, when modulus control signal 26 is high.

Figure 2:
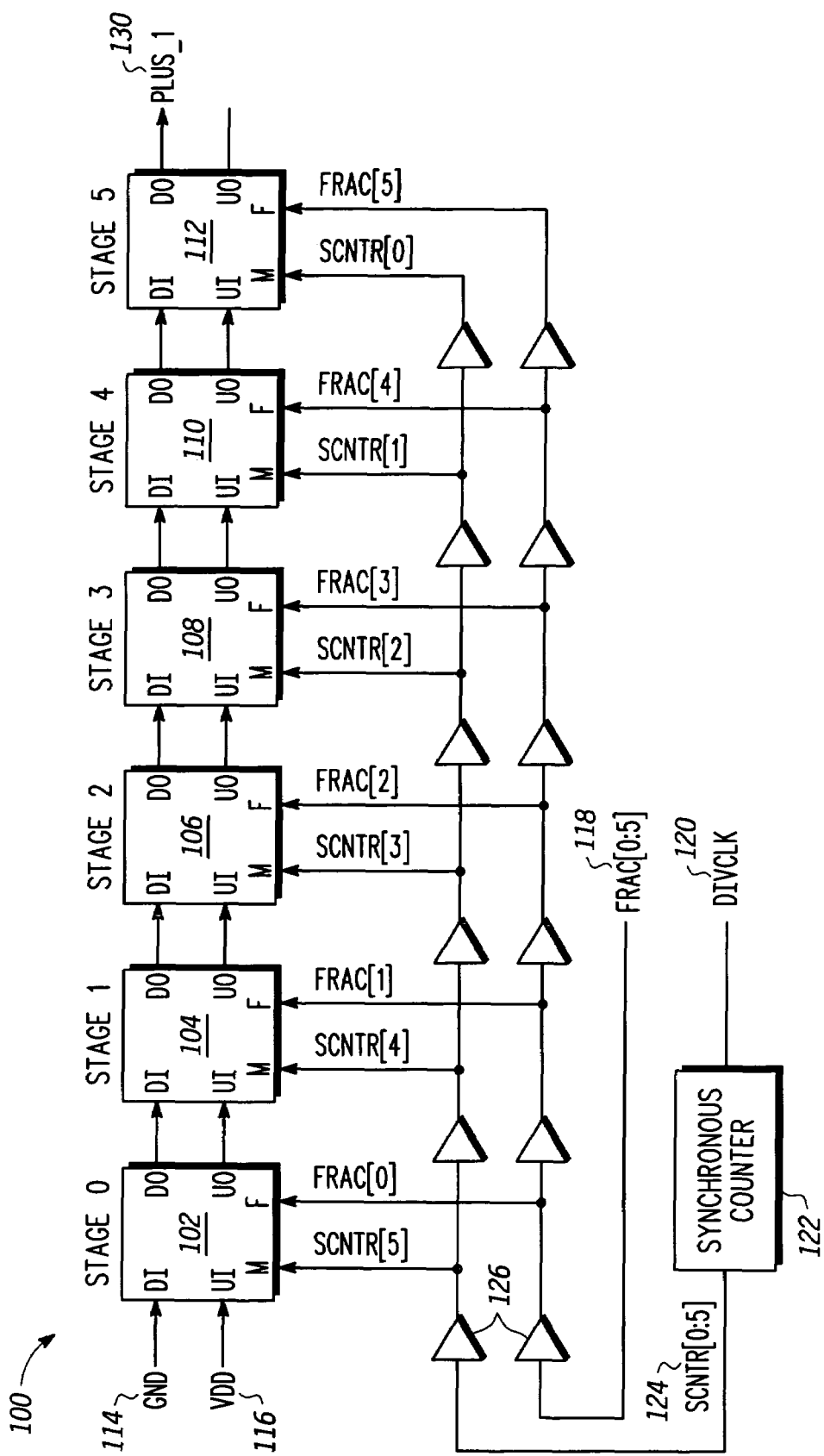
FIG. 2 is a block diagram of an exemplary modulus divider controller, consistent with one embodiment of the invention.

FIG. 2 is a block diagram of an exemplary modulus divider controller, consistent with one embodiment of the invention. By way of a non-limiting example, modulus divider controller 100 may include a series of cascaded binary stream switching circuits (102, 104, 106, 108, 110, and 112). Each binary switching circuit may have two inputs and two outputs. In one embodiment, a first input 114 of a first binary stream switching circuit 102 may be coupled to ground, thus it may be a logic low signal and the second input 116 of first binary stream switching circuit 102 may be coupled to a voltage source (Vdd, for example) and thus it may be a logic high signal. First binary stream switching circuit 102 may also have a first switching input corresponding to the least significant bit (shown as sentr) of a count 124 generated by a synchronous counter 122. Synchronous counter 122 may count divided clock 120 (13 of FIG. 1). First binary stream switching circuit 102 may also have a second switching input corresponding to the most significant bit (for example, frac[0]) of a division control word 118 (shown as frac[0:5]). Division control word 118 may specify a fractional division ratio for the synthesized clock.

Still referring to FIG. 2, a second binary stream switching circuit 104 may have a first output of first binary stream switching circuit 102 as a first input and the second output of first binary stream switching circuit 102 as a second input. Second binary stream switching circuit 104 may further have a first switching input corresponding to a bit next to the least significant bit (shown as sentr[4]) of the count generated by synchronous counter 122. Second binary stream switching circuit 104 may further have a second switching input corresponding to a bit next to the most significant bit of the division control word (shown as frac). Second binary stream switching circuit 104 may generate a modulus control output (corresponding to the output labeled as do) for modulus divider (22 of FIG. 1) based on the first input, the second input, the first switching input, and the second switching input. By way of example, FIG. 2 shows four additional stages of binary stream switching circuits (106, 108, 110, and 112) cascaded in series with first binary stream switching circuit 102 and second binary stream switching circuit 104. Although FIG. 2 shows a six stage modulus divider controller 100, a modulus divider controller may have fewer or more stages. Thus, by way of example, as shown in FIG. 2, stage 5 binary stream switching circuit 112 generates modulus control output 130.

Additionally, as shown in FIG. 2, modulus divider controller 102 may further include a buffer 126 for delaying a signal corresponding to the first switching input. Modulus divider controller 102 may further include an additional buffer 126 for delaying a signal corresponding to the second switching input. Buffers 126 may delay the first switching input and the second switching input such that the first switching input and the second switching input are synchronized in time with other inputs to each binary stream switching circuit stage of modulus divider controller 102.

Figure 3:
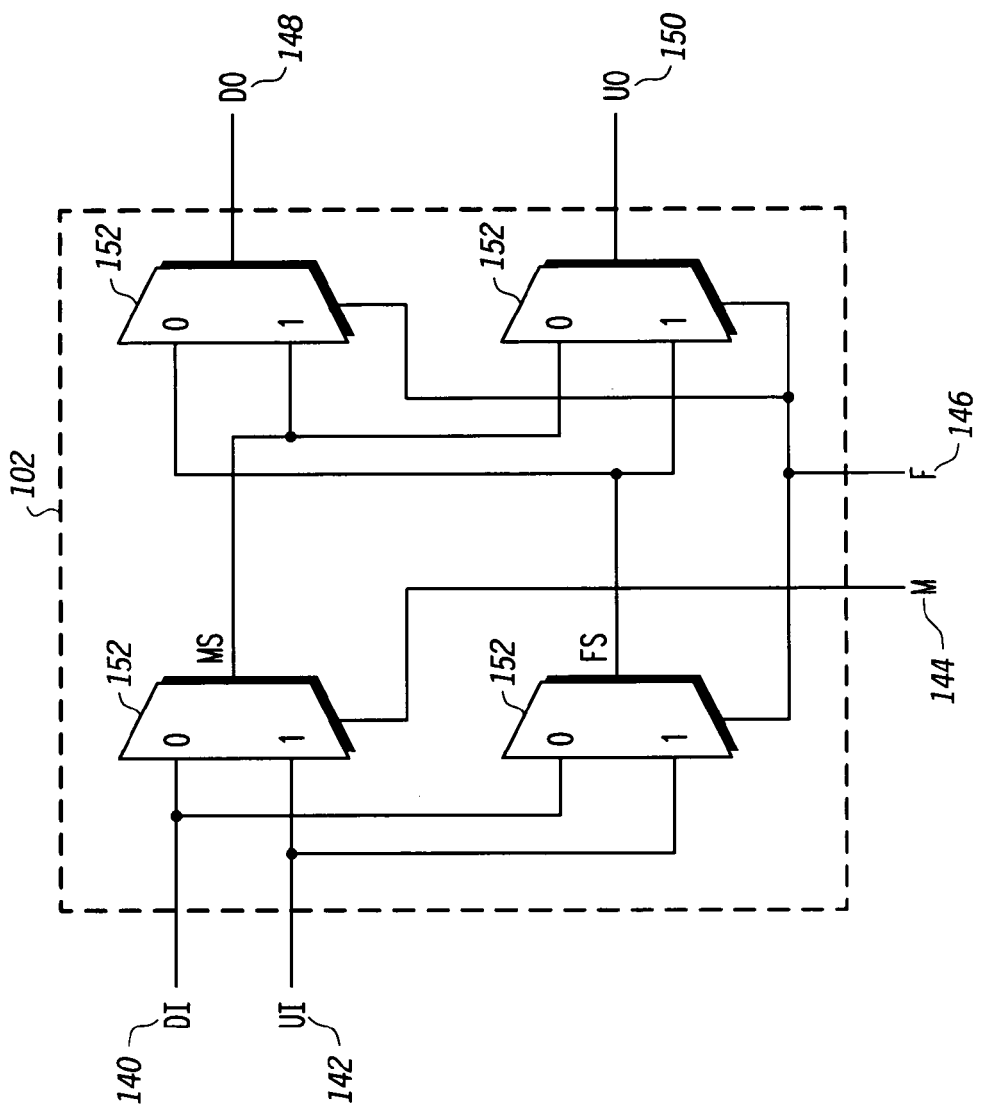
FIG. 3 is a block diagram of an exemplary binary stream switching circuit, consistent with one embodiment of the invention.

FIG. 3 is a block diagram of an exemplary binary stream switching circuit, consistent with one embodiment of the invention. By way of example, binary stream switching circuit 102 may receive two inputs 140 and 142 (shown as DI and UI), each of which may be a binary number stream. The input binary streams (140 and 142) may be multiplexed using multiplexers 152 based on switching inputs 144 and 146 (shown as M and F), respectively, to generate output binary streams 148 and 150 (shown as DO and UO). As explained above, first switching input 144 for a first stage binary stream switching circuit, such as 102, may correspond to a least significant bit of a count (for example, sentr[5]) generated by synchronous counter 122. Second switching input 146 may correspond to a most significant bit (for example, frac[0]) of a division control word (118 of FIG. 2). First binary stream switching circuit 102 and other binary switching circuits shown in FIG. 2 may implement the following truth table:

TABLE 1

| First switching input (M) | Second switching input (F) | DO | UO |
|---|---|---|---|
| 0 | 0 | DI | DI |
| 0 | 1 | DI | UI |
| 1 | 0 | DI | UI |
| 1 | 1 | UI | UI |

As shown in Table 1, first binary stream switching circuit 102 may generate a logic low modulus control output (DO) when first switching input 144 and second switching input 146 are both logic low. First binary stream switching circuit 102 may generate a logic low modulus control output (DO) when first switching input 144 is logic low and second switching input 146 is logic high. Also, first binary stream switching circuit 102 may generate a second output (UO), which may be coupled as an input to second binary stream switching circuit 104. First binary stream switching circuit 102 may generate a logic low modulus control output (DO) when first switching input 144 is logic high and second switching input 146 is logic low. First binary stream switching circuit 102 may generate a logic high modulus control output (DO) when first binary switching input 144 and second switching input 146 are both logic high. Other binary switching circuits (104, 106, 108, 110, and 112) shown in FIG. 2 may also implement the truth table shown in Table 1. Although FIG. 3 shows a specific implementation of a binary switching circuit 102, any suitable implementation to generate the truth table shown in Table 1 may be used to implement binary switching circuit 102. As apparent from Table 1, each binary switching circuit stage generates a pair of outputs based on a pair of inputs. However, only output (DO) of the final stage (for example, 112 of FIG. 2) is used as a modulus control input.

Figure 4:
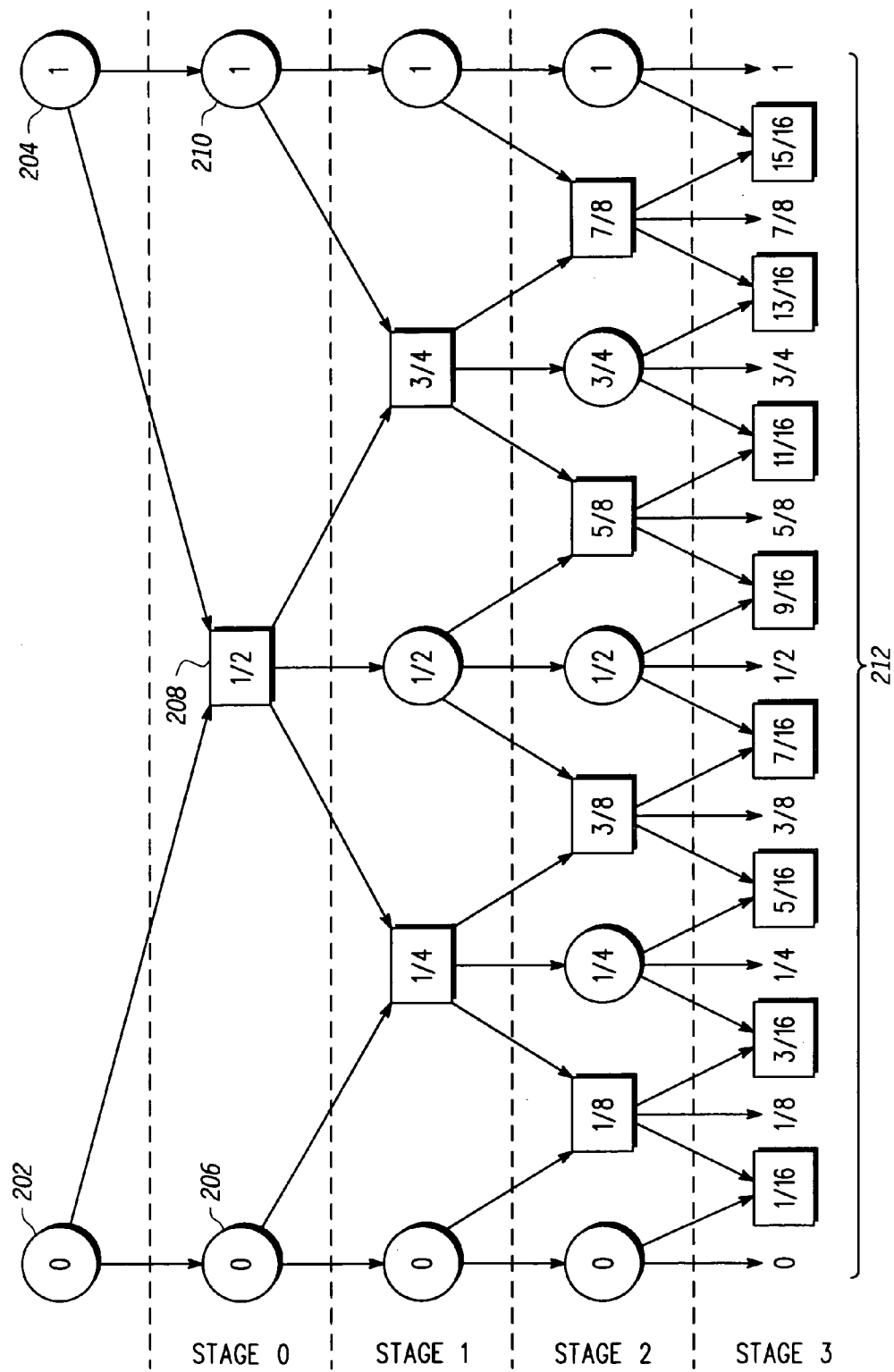
FIG. 4 is a diagram illustrating exemplary generation of a fractional division ratio corresponding to a method for generating a synthesized clock, consistent with one embodiment of the invention.

FIG. 4 is a diagram illustrating exemplary generation of a fractional division ratio corresponding to a method for generating a synthesized clock, consistent with one embodiment of the invention. As shown, a pair of inputs (202 and 204) may be processed by a binary switching circuit or an equivalent circuit to generate a selected pair (206 and 208) or (208 and 210) based on an input corresponding to a division control word. As explained above, the division control word may specify a fractional division ratio for the synthesized clock. Based on the selected pair of outputs a modulus divider control output may be generated by modulus divider controller (22 of FIG. 1). Cascaded stages of binary switching circuits or equivalent circuits may generate several pairs of outputs (212), each of which may be selected based on the input corresponding to the division control word.

FIG. 5 is a diagram illustrating inputs and outputs for a series of cascaded binary stream switching circuits, consistent with embodiments of the invention. By way of example, FIG. 5 shows inputs and outputs for a series of four cascaded binary stream switching circuits. Bits corresponding to a count 220 generated by a synchronized counter is shown as a first switching input. Bits corresponding to a division control word, such as 0011 for the example shown in FIG. 5 (230) may be the second switching input to the binary stream switching circuits. Column 222 represents two switching inputs (MS and FS) and two outputs (DO and UO) for the first binary stream switching circuit, stage 0. Column 224 represents two switching inputs (MS and FS) and two outputs (DO and UO) for the second binary stream switching circuit, stage 1. Column 226 represents two switching inputs (MS and FS) and two outputs (DO and UO) for the third binary stream switching circuit, stage 2. Column 228 represents two switching inputs (MS and FS) and two outputs (DO and UO) for the fourth binary stream switching circuit, stage 3. Thus, exemplary division control word 0011 may correspond to a fractional division ratio of 3/16 ($0*2^{-1}+0*2^{-2}+1*2^{-3}+1*2^{-4}$). As shown in column 228 (stage 3) consistent with the 3/16 fractional division ratio, modulus control output (DO) over a 16 cycle period may include three 1s and 13 0s.

Figure 6:
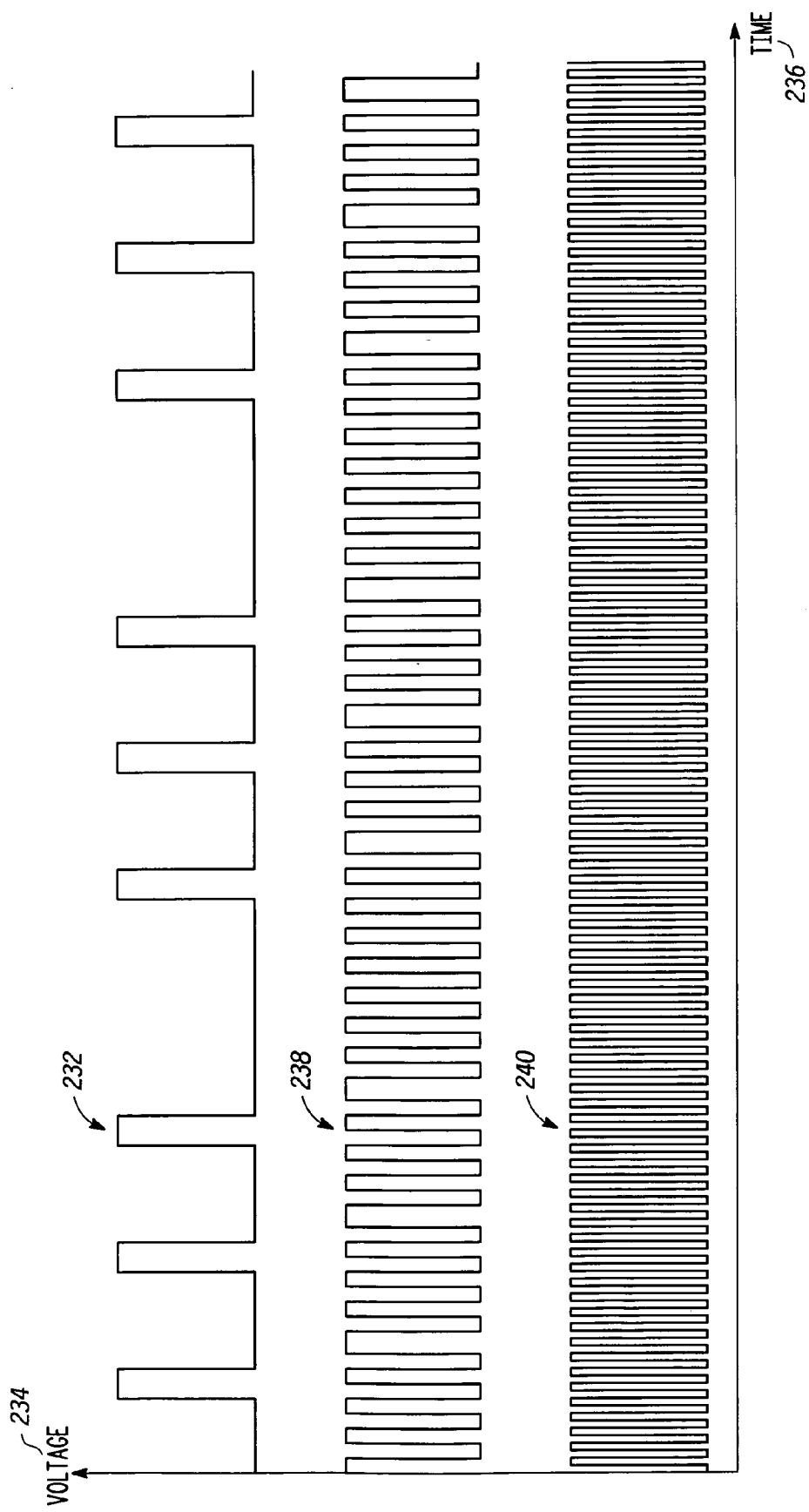
FIG. 6 is a diagram illustrating a waveform of a modulus control input, a waveform of a divided clock, and a waveform of a synthesized clock, consistent with one embodiment of the invention.

FIG. 6 is a diagram illustrating a waveform of a modulus control output, a waveform of a divided clock, and a waveform of a synthesized clock, corresponding to the example inputs and outputs shown in FIG. 5, consistent with embodiments of the invention. In particular, FIG. 6 shows a waveform 232 of modulus control output signal 26 in terms of change in voltage 234 with time 236. Also shown is a waveform 238 of divided clock 13 in terms of change in voltage 234 with time 236. Further shown is a waveform 240 of synthesized clock 20 in terms of change in voltage 234 with time 236. As shown in FIG. 6, waveform 240 corresponding to synthesized clock 20 has a uniform frequency. Waveform 232 corresponding to modulus control output signal 26 shows periodic pulses corresponding to a logic high state. When waveform 232 assumes a logic high state, since synthesized clock 20 is divided by N+1, waveform 238 corresponding to divided clock 13 has a longer time period immediately following the logic high state of waveform 232.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A modulus divider controller coupled to a modulus divider for generating a synthesized clock from a reference clock, wherein the modulus divider generates a divided clock, the modulus divider controller comprising:
    a first binary stream switching circuit having a first output and a second output, the first binary stream switching circuit further having a logic low input and a logic high input and a first switching input corresponding to a least significant bit of a count generated by a synchronous counter, wherein the synchronous counter counts the divided clock, and a second switching input corresponding to a most significant bit of a division control word, wherein the division control word specifies a fractional division ratio for the synthesized clock; and
    a second binary stream switching circuit having the first output of the first binary stream switching circuit as a first input and the second output of the first binary stream switching circuit as a second input, the second binary stream switching circuit further having a first switching input corresponding to a bit next to the least significant bit of the count generated by the synchronous counter and a second switching input corresponding to a bit next to the most significant bit of the division control word, wherein the second binary stream switching circuit generates a modulus control output for the modulus divider based on the first input, the second input, the first switching input, and the second switching input corresponding to the second binary stream switching circuit.

2. The modulus divider controller of claim 1 further comprising a first buffer for delaying a signal corresponding to the first switching input of the first binary stream switching circuit.

3. The modulus divider controller of claim 2 further comprising a second buffer for delaying a signal corresponding to the second switching input.

4. The modulus divider controller of claim 3, wherein the first buffer delays the signal corresponding to the first switching input and the second buffer delays the signal corresponding to the second switching input such that they are synchronized in time with respect to other inputs.

5. The modulus divider controller of claim 1, wherein the first binary stream switching circuit generates a modulus control output corresponding to logic low when the first switching input and the second switching input are each logic low.

6. The modulus divider controller of claim 1, wherein the first binary stream switching circuit generates a modulus control output corresponding to logic low when the first switching input is logic low and the second switching input is logic high.

7. The modulus divider controller of claim 1, wherein the first binary stream switching circuit generates a modulus control output corresponding to logic low when the first switching input is logic high and the second switching input is logic low.

8. The modulus divider controller of claim 1, wherein the first binary stream switching circuit generates a modulus control output corresponding to logic high when the first switching input and the second switching input are each logic high.

9. The modulus divider controller of claim 1, wherein the modulus control output is received as an input for a modulus divider.

10. The modulus divider controller of claim 9, wherein the input for the modulus divider determines whether the synthesized clock is divided by N or N+1.

11. A method for generating a synthesized clock from a reference clock using a modulus divider, the method comprising:
    receiving a pair of inputs and a logic low input and a logic high input;
    receiving a first switching input corresponding to a least significant bit of a count generated by a synchronous counter that counts a divided clock; receiving a second switching input corresponding to a most significant bit of a division control word, wherein the division control word specifies a fractional division ratio for the synthesized clock;
    generating a first output and a second output based on the logic low input, the logic high input, and the first switching input; and
    generating a modulus divider control output based on the first output, the second output, at least one other switching input corresponding to at least one other bit of the count, and at least one other switching input corresponding to at least one other bit of the division control word.

12. The method of claim 11 further comprising receiving the modulus divider control output at a modulus divider and dividing the synthesized clock by N or N+1 based on the modulus divider control output to generate a divided clock.

13. The method of claim 12 further comprising feeding back the divided clock to an input of a phase frequency detector.

14. The method of claim 13 further comprising comparing the divided clock to a reference clock to generate a voltage signal and inputting the voltage signal to a voltage controlled oscillator.

15. An apparatus for generating a synthesized clock from a reference clock using a modulus divider, the apparatus comprising:
   means for receiving a pair of inputs and a logic low input and a logic high input;
   means for receiving a first switching input corresponding to a least significant bit of a count generated by a synchronous counter that counts a divided clock; means for receiving a second switching input corresponding to a most significant bit of a division control word, wherein the division control word specifies a fractional division ratio for the synthesized clock;
   means for generating a first output and a second output based on the logic low input, the logic high input, and the first switching input; and
   means for generating a modulus divider control output based on the first output, the second output, at least one other switching input corresponding to at least one other bit of the count, and at least one other switching input corresponding to at least one other bit of the division control word.

16. The apparatus of claim 15 further comprising means for dividing the synthesized clock by N or N+1 based on the modulus divider control output to generate a divided clock.

17. The apparatus of claim 15 further comprising means for comparing the divided clock to a reference clock to generate a voltage signal.

* * * * *